(12) United States Patent
Shannon et al.

(10) Patent No.: US 7,431,857 B2
(45) Date of Patent: *Oct. 7, 2008

(54) PLASMA GENERATION AND CONTROL USING A DUAL FREQUENCY RF SOURCE

(75) Inventors: Steven C. Shannon, San Mateo, CA (US); Alex Paterson, San Jose, CA (US); Theodoros Panagopoulos, Santa Clara, CA (US); John P. Holland, San Jose, CA (US); Dennis Grimard, Ann Arbor, MI (US); Yashushi Takakura, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 489 days.

This patent is subject to a terminal disclaimer.

(21) Appl. No.: 10/843,914

(22) Filed: May 12, 2004

(65) Prior Publication Data

US 2005/0034816 A1   Feb. 17, 2005

Related U.S. Application Data

(60) Provisional application No. 60/495,523, filed on Aug. 15, 2003.

(51) Int. Cl.
  *G01R 31/00* (2006.01)
(52) U.S. Cl. .............................. 216/59; 216/61; 216/67; 438/706; 438/710; 438/714
(58) Field of Classification Search .................. 216/59, 216/61, 67; 438/706, 710, 714
See application file for complete search history.

(56) References Cited

U.S. PATENT DOCUMENTS

| | | | |
|---|---|---|---|
| 4,579,618 A | 4/1986 | Celestino et al. | |
| 4,585,516 A * | 4/1986 | Corn et al. | 438/714 |
| 4,863,549 A | 9/1989 | Grunwald | |
| 5,065,118 A | 11/1991 | Collins et al. | |
| 5,077,499 A | 12/1991 | Oku | |
| 5,512,130 A * | 4/1996 | Barna et al. | 438/714 |

(Continued)

FOREIGN PATENT DOCUMENTS

EP   0553704   8/1993

(Continued)

OTHER PUBLICATIONS

U.S. Appl. No. 11/060,980, filed Feb. 18, 2005, Paterson et al.

(Continued)

*Primary Examiner*—Shamim Ahmed
(74) *Attorney, Agent, or Firm*—Moser IP Law Group

(57) ABSTRACT

A method and apparatus for generating and controlling a plasma in a semiconductor substrate processing chamber using a dual frequency RF source is provided. The method includes the steps of supplying a first RF signal from the source to an electrode within the processing chamber at a first frequency and supplying a second RF signal from the source to the electrode within the processing chamber at a second frequency. The second frequency is different from the first frequency by an amount equal to a desired frequency. Characteristics of a plasma formed in the chamber establish a sheath modulation at the desired frequency.

21 Claims, 4 Drawing Sheets

U.S. PATENT DOCUMENTS

| | | | |
|---|---|---|---|
| 5,534,751 A * | 7/1996 | Lenz et al. | 315/111.71 |
| 5,556,501 A | 9/1996 | Collins et al. | |
| 5,570,031 A * | 10/1996 | Sasaki et al. | 324/750 |
| 5,643,364 A | 7/1997 | Zhao et al. | |
| 5,698,062 A * | 12/1997 | Sakamoto et al. | 156/345.44 |
| 5,817,534 A | 10/1998 | Ye et al. | |
| 5,985,375 A | 11/1999 | Donohoe et al. | |
| 6,089,181 A | 7/2000 | Suemasa et al. | |
| 6,110,287 A | 8/2000 | Arai et al. | |
| 6,113,731 A | 9/2000 | Shan et al. | |
| 6,126,778 A | 10/2000 | Donohoe et al. | |
| 6,190,496 B1 | 2/2001 | DeOrnellas et al. | |
| 6,193,855 B1 | 2/2001 | Gopalraja et al. | |
| 6,309,978 B1 * | 10/2001 | Donohoe et al. | 438/710 |
| 6,312,556 B1 | 11/2001 | Donohoe et al. | |
| 6,354,240 B1 | 3/2002 | DeOrnellas et al. | |
| 6,411,490 B2 * | 6/2002 | Dible | 361/234 |
| 6,642,149 B2 | 11/2003 | Suemasa et al. | |
| 2002/0039626 A1 | 4/2002 | Nakahigashi et al. | |
| 2002/0041160 A1 | 4/2002 | Barnes et al. | |
| 2003/0127319 A1 | 7/2003 | Demaray et al. | |
| 2003/0148611 A1 * | 8/2003 | Dhindsa et al. | 438/689 |
| 2004/0045669 A1 | 3/2004 | Okumura et al. | |
| 2005/0090118 A1 * | 4/2005 | Shannon et al. | 438/706 |

FOREIGN PATENT DOCUMENTS

| | | |
|---|---|---|
| JP | 10-326698 A * | 12/1998 |
| JP | 2003-073836 | 3/2003 |
| WO | WO 2003-43061 | 5/2003 |

OTHER PUBLICATIONS

Georgieva, V., et al., "Numerical study of $Ar/CF_4N_2$ discharges in single- and dual-frequency capacitively coupled plasma reactors", *Journal of Applied Physics*, vol. 94, No. 6 (Sep. 15, 2003), 3748-3756.

Lieberman, M. A., et al., "Standing wave and skin effects in large-area, high-frequency capacitive discharges", *Plasma Sources Sci. Technol.*, 11 (2002), 283-293.

* cited by examiner

PLASMA GENERATION AND CONTROL USING A DUAL FREQUENCY RF SOURCE

CROSS-REFERENCE TO RELATED APPLICATIONS

This application claims the benefit of U.S. Provisional Application No. 60/495,523 filed Aug. 15, 2003, which is hereby incorporated by reference.

BACKGROUND OF THE INVENTION

1. Field of the Invention

The present invention generally relates to semiconductor substrate processing systems and, more particularly, to plasma generation and control using a dual frequency RF source.

2. Description of the Related Art

Plasma enhanced semiconductor processing chambers are widely used to manufacture integrated circuit devices. In most plasma enhanced chambers, multiple radio frequency (RF) sources are utilized to form and control the plasma. For example, an RF source with a high frequency is typically used for plasma formation and ion dissociation. Additionally, an RF source with a lower frequency is often used to modulate the plasma sheath in order to control the accumulation of a DC voltage (i.e., bias voltage) on the substrate. The cost of the various sources and their related matching circuits are quite substantial and contribute to the high cost of the equipment needed to fabricate integrated circuits. Reducing the RF infrastructure without sacrificing any process benefit would result in significant cost savings.

Therefore, there is a need for an improved method and apparatus for plasma generation and control in a plasma enhanced semiconductor substrate processing.

SUMMARY OF THE INVENTION

The present invention is a method and apparatus for generating and controlling a plasma in a plasma enhanced semiconductor substrate processing chamber. The method includes the steps of supplying a first RF signal from the source to an electrode within the processing chamber at a first frequency and supplying a second RF signal from the source to the electrode within the processing chamber at a second frequency. The second frequency is different from the first frequency by an amount equal to a desired frequency. Characteristics of a plasma formed in the chamber establish a sheath modulation at the desired frequency (i.e., the frequency difference between the first and second frequency).

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The present invention is a method and apparatus for forming and controlling a plasma in a plasma enhanced semiconductor processing chamber using a dual frequency RF source. Plasma enhanced semiconductor processing chambers generally utilize power fed at two frequencies: a high frequency for plasma excitation and ion dissociation; and a low frequency for plasma sheath modulation. In one embodiment, the present invention utilizes two high frequency inputs generated from a single RF source to generate the plasma. The sheath modulation is controlled by utilization of a wave packet phenomenon that creates a low frequency component in the plasma sheath equivalent to the difference in frequency between the two input signals.

Figure 1:
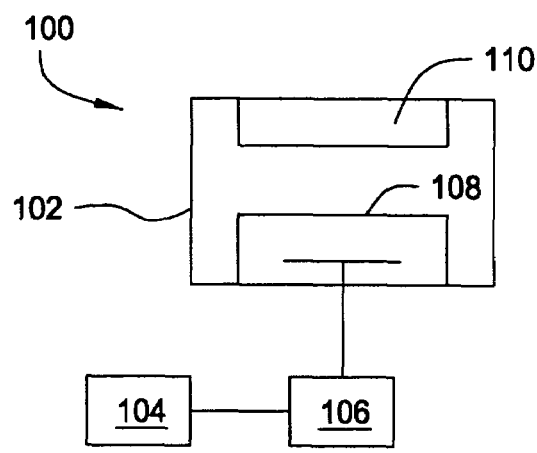
FIG. 1 depicts an exemplary block diagram of a plasma enhanced semiconductor processing chamber having a dual frequency RF source.

FIG. 1 depicts a simplified block diagram of a plasma enhanced semiconductor processing chamber having a dual frequency RF source. A plasma enhanced processing chamber 100 according to the present invention includes a chamber 102, a dual frequency RF power source 104, and a single matching circuit 106. The chamber 102 includes a powered electrode 108 that is coupled to the source 104 through the matching circuit 106 and a grounded electrode 110. The chamber 102 is otherwise similar to a conventional plasma enhanced processing chamber with the exception of the reduced RF infrastructure.

The source 104 is an RF generator with dual frequency excitation. The source 104 is generally capable of generating two frequencies in the range of from about 100 KHz to about 200 MHz. The source 104 is also generally able to produce up to 5000 W of either continuous or pulsed power. In one specific embodiment, the source produces both about 13 MHz and about 14 MHz, each frequency at about 3 KW.

Figure 2:
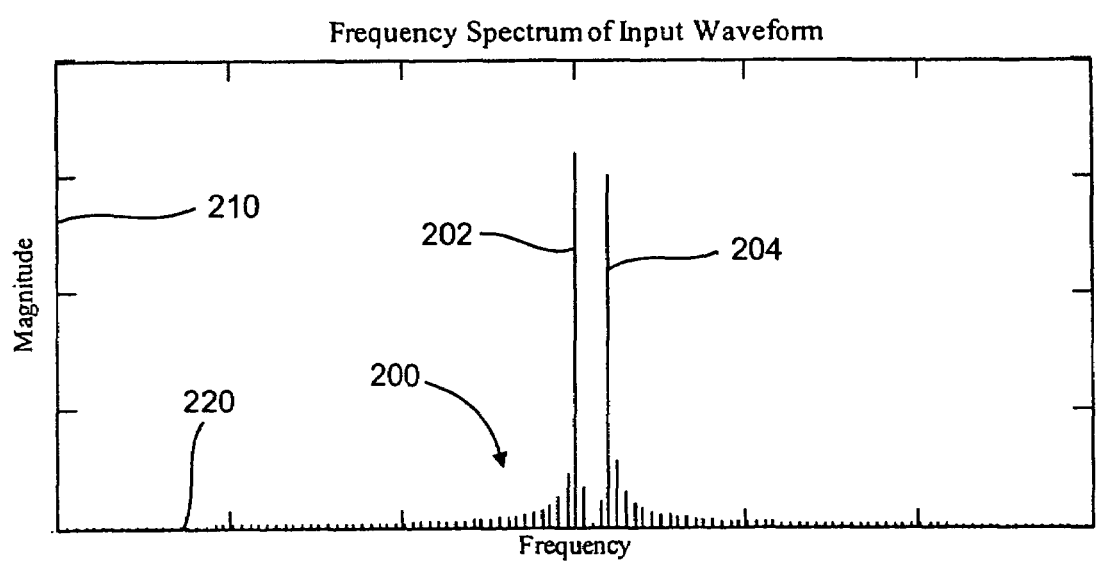
FIG. 2 is a graph of the frequency spectrum of an input waveform on the electrode.
Figure 3:
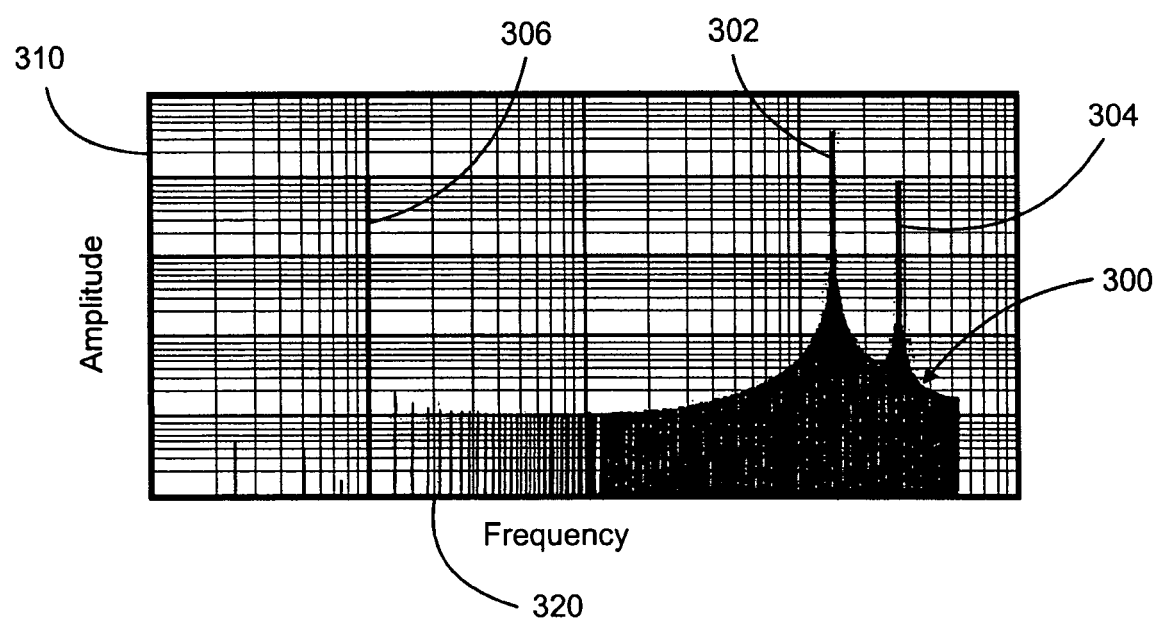
FIG. 3 is a graph of the frequency spectrum of the sheath voltage.

In operation, the two frequencies generated by the source 104 generally have about the same magnitude at the output of the source 104 and are selected such that each of the individual frequencies control a defined subset of plasma characteristics, such as high frequency plasma excitation, ion dissociation, and the like. The frequencies are also selected to be in close proximity to each other to allow for common matching through the matching circuit 106, as discussed further below. The difference between the two selected frequencies produces a wave packet effect that may be utilized to control a second subset of plasma characteristics, such as low frequency plasma excitation, sheath voltage modulation, and the like. This wave packet effect is illustrated in FIGS. 2 and 3. Alternatively, the ratio between the magnitude of the two frequency signals generated by the source 104 may be varied in order to control the magnitude of the wave packet effect created by the difference between the two frequencies.

The plasma characteristics controlled by the dual frequencies and the wave packet effect created from their difference may overlap (i.e., some or all of the characteristics controlled, such as plasma excitation or sheath modulation, may be at least partially controlled by both the dual frequencies provided by the source 104 and by the resulting wave packet effect created by the difference between the two frequencies.) Other subsets of plasma characteristics may be controlled by additional RF signals coupled to the plasma. For example, a third subset of plasma characteristics may be controlled by an RF signal provided by another RF source coupled to another electrode disposed in the chamber, as discussed with reference to FIG. 6, below.

FIG. 2 depicts the magnitude 210 of the Fourier components for the input waveform incident on the powered electrode 108 of the plasma chamber 102 as a function of frequency 220, and FIG. 3 depicts a frequency analysis of the sheath voltage waveform 300, showing the amplitude 310 of the resulting frequency components in the sheath as a function of frequency 320. As can be seen in FIG. 2, the frequency spectrum of the input waveform 200 includes two expected peaks 202, 204, corresponding to frequency 1 and frequency 2 being generated by the source 104. However, as can be seen in FIG. 3, a low frequency term (peak 306) is generated in the sheath in addition to the primary drive frequencies (peaks 302 and 304) from the source 104 and their expected harmonics. The sheath has a non-linear characteristic curve that affects the RF signals in the same manner as an RF mixer diode affects input RF signals, i.e., a beat frequency is formed that equals the difference between the two input frequencies. As such, the low frequency term (peak 306) is equal to the difference between the two frequencies generated by the source 104.

The maximum difference in drive frequencies generated by source 104 is determined by the characteristics of the matching circuit 106. Particularly, the resonant bandwidth of the matching circuit 106 is centered between the drive frequencies. The matching circuit 106 must have a Q that defines a bandwidth that efficiently couples both frequencies to the electrode 108 and the plasma. As long as the two drive frequencies fall substantially within the bandwidth of the matching circuit, the RF infrastructure is capable of supporting the two separate frequencies. Frequency differences on the order of the low frequency range typically employed for such process enhancement is available with current match technology.

Figures 4A, 4B:
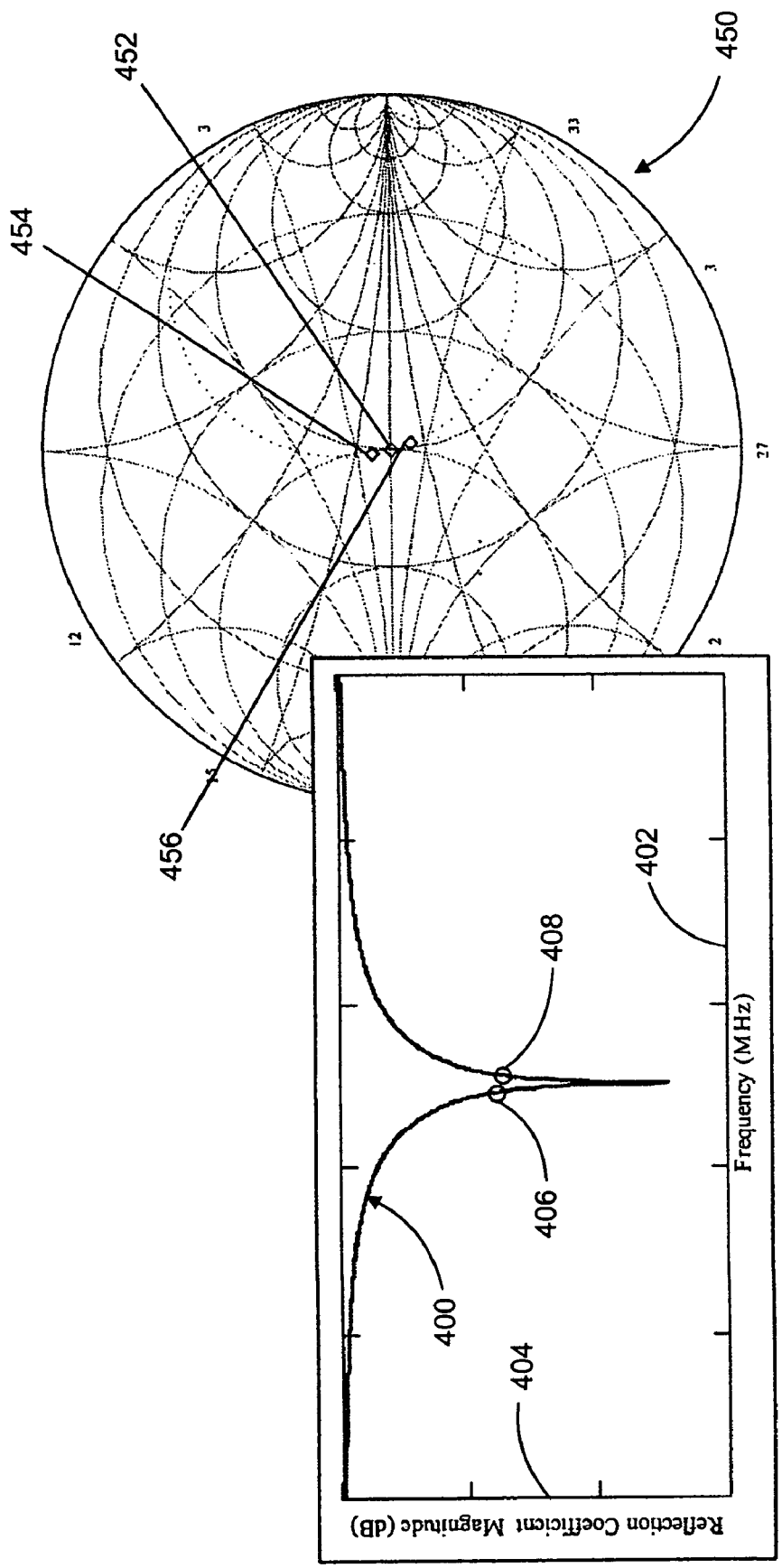
FIG. 4A is a graph of reflection coefficient magnitude versus frequency.
FIG. 4B is a Smith chart for the match element model.

FIG. 4A shows a plot 400 of the reflection coefficient in terms of magnitude for a typical L-type match and depicts the frequency in MHz along an axis 402 versus a reflection coefficient magnitude in decibels along an axis 404. The frequencies selected should be such that the reflection coefficient magnitude is small and substantially equal, as depicted by dots 406 and 408, for frequencies 1 and 2 generated by the source 104.

FIG. 4B shows the location of the frequencies in real/imaginary space for a typical L-type match. The exemplary Smith chart 450 depicted in FIG. 4B denotes a 50Ω load such as is generally present in standard RF power sources. The frequencies should be selected such that they fall as close to the center 452 of the Smith chart 450 as possible to provide reasonably low reflected power, as depicted by the exemplary frequencies 454, 456 in FIG. 4B.

For example, to excite a plasma at 60 MHz and 2 MHz, two separate power sources and matches for these frequencies would normally be required in a standard plasma enhanced semiconductor processing chamber. However, in the current invention, two selected frequencies are centered around the high frequency value, i.e., the average of the two frequencies will be the high frequency component, and the two frequencies will be differentiated by a span equal to the desired lower frequency. In the present example, frequencies at 59 MHz and 61 MHz would be fed from a common source 104 through a common matching circuit 106, thus applying both a plasma excitation (59 and 61 MHz signals) and a 2 MHz modulation signal across the plasma sheath. This configuration reduces the RF infrastructure in current dual frequency technology from two sources and either two independent match elements or a single dual frequency match element to a single source and one single frequency match element, significantly reducing the cost of the system without sacrificing process benefit.

Examples of plasma enhanced semiconductor processing chambers that may be adapted to benefit from the present invention include, but are not limited to, the Decoupled Plasma Source (DPS®, DPS® II), EMAX™, MXP®, and ENABLER™ processing chambers, all available from Applied Materials, Inc. of Santa Clara, Calif. The EMAX™ processing chamber is described in U.S. Pat. No. 6,113,731, issued Sep. 5, 2000 to Shan et al. The MXP® processing chamber is described in U.S. Pat. No. 5,534,108, issued Jul. 9, 1669 to Qian et al., and U.S. Pat. No. 5,674,321, issued Oct. 7, 1997 to Pu et al. The ENABLER™ processing chamber is described in U.S. Pat. No. 6,528,751, issued Mar. 4, 2003 to Hoffman et al. Each of these above-mentioned patents are hereby incorporated by reference in their entireties.

Figure 5:
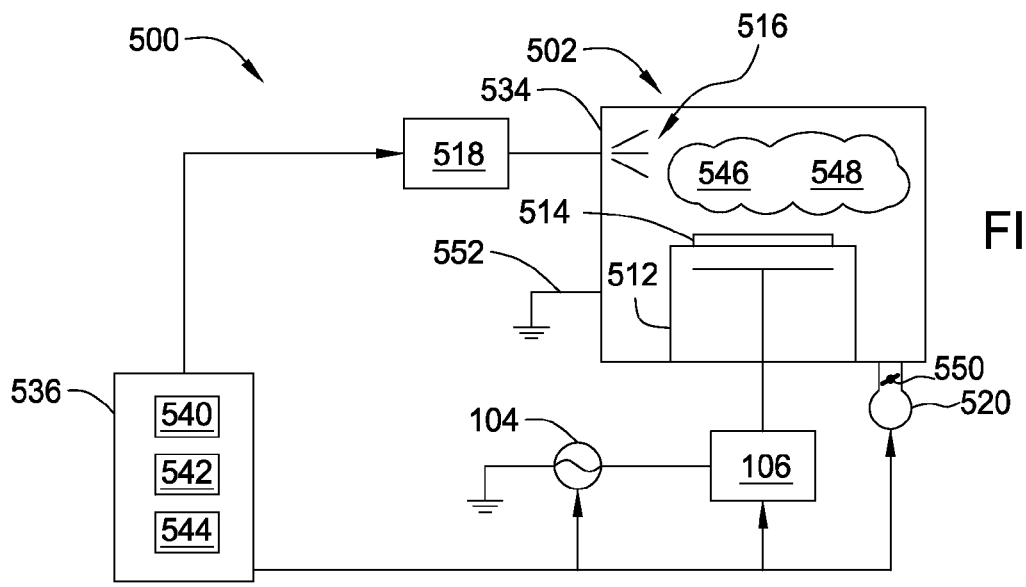
FIG. 5 is a simplified schematic of one embodiment of a processing chamber having a dual frequency RF source.

FIG. 5 depicts a schematic diagram of one illustrative embodiment of an etch reactor 500 suitable for use with the present invention. In one embodiment, the reactor 500 includes a process chamber 502 having a substrate support pedestal 512 within a conductive body (wall) 534, and a controller 536. The support pedestal 512 is coupled through the matching circuit 106 to the dual frequency RF power source 104. (The source 104 and the matching circuit 106 are described above with respect to FIG. 1.)

The controller 536 includes a central processing unit (CPU) 540, a memory 542, and support circuits 544 for the CPU 540 and facilitates control of the components of the process chamber 502 and, as such, of the etch process, as discussed below in further detail. The controller 536 may be one of any form of general-purpose computer processor that can be used in an industrial setting for controlling various chambers and sub-processors. The memory, or computer-readable medium, 542 of the CPU 540 may be one or more of readily available memory such as random access memory (RAM), read only memory (ROM), floppy disk, hard disk, or any other form of digital storage, local or remote. The support circuits 544 are coupled to the CPU 540 for supporting the processor in a conventional manner. These circuits include cache, power supplies, clock circuits, input/output circuitry and subsystems, and the like. The inventive method is generally stored in the memory 542 as a software routine. The software routine may also be stored and/or executed by a second CPU (not shown) that is remotely located from the hardware being controlled by the CPU 540.

In a basic etch operation, a substrate 514 is placed on the pedestal 512 and process gases are supplied from a gas panel 518 through entry ports 516 and form a gaseous mixture 546. The gaseous mixture 546 is ignited into a plasma 548 in the chamber 502 by applying power from the dual RF source 104 to the substrate support pedestal 512. The two frequencies generated by the source 104 are generally selected in the high frequency range in order to promote plasma excitation and ion dissociation. The two frequencies generated by the source 104 are further differentiated by a predetermined span equal to a particular low frequency desirable, for example, for modulating the plasma sheath.

Typically, the chamber wall 534 is coupled to an electrical ground 552. The pressure within the interior of the chamber 502 is controlled using a throttle valve 550 and a vacuum pump 520. The temperature of the wall 534 is controlled using liquid-containing conduits (not shown) that run through the wall 534.

Other forms of etch chambers may be used to practice the invention, including chambers with remote plasma sources, microwave plasma chambers, electron cyclotron resonance (ECR) plasma chambers, and the like. This technique is likewise not limited to etch but to any other plasma assisted process, including deposition, annealing, nitridation, implantation, and the like.

Figure 6:
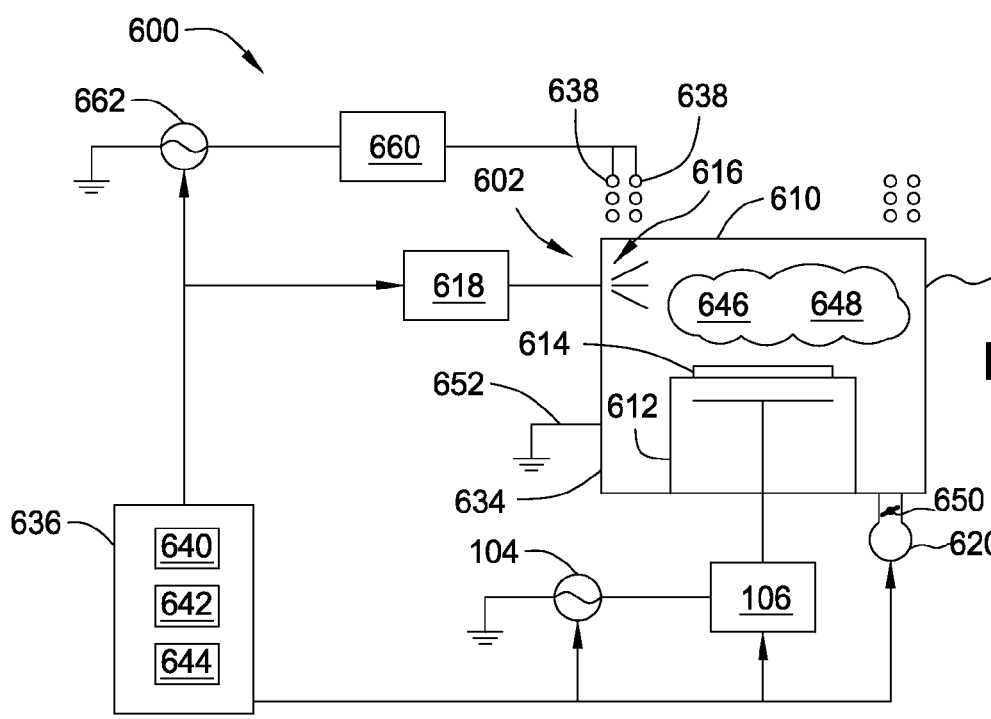
FIG. 6 is a simplified schematic of another embodiment of a processing chamber having a dual frequency RF source.

For example, FIG. 6 depicts a schematic diagram of another illustrative embodiment of an etch reactor 600 suitable for use with the present invention. In one embodiment, the reactor 600 includes a process chamber 602 having a substrate support pedestal 612 within a conductive body (wall) 634, and a controller 636. The controller 636 is similar to controller 536 described above with reference to FIG. 5. The support pedestal 612 is coupled through a matching circuit 106 to a dual frequency RF power source 104. (The source 104 and matching circuit 106 are described above with respect to FIG. 1.) The chamber 602 further includes a dielectric ceiling 610 with at least one inductive coil 638 disposed thereabove (two coils 638 are depicted in the embodiment of FIG. 6). The inductive coils 638 are coupled to a second power source 662 through a second match element 660. The source 662 is generally a single RF generator capable of producing up to 3000 W at a tunable frequency in a range of from about 50 kHz to about 13.56 MHz. The frequency range given for the source 662 is the range generally used in processing chambers having an inductively coupled top source. Other ranges are appropriate and may be used with the present invention in other types of processing chambers. For example, in a chamber with a capacitively coupled top source, the source generally produces signals with frequencies as high as 200 MHz. Alternatively, microwave sources may produce frequencies as high as 5 GHz.

In a basic etch operation, a substrate 614 is placed on the pedestal 612 and process gases are supplied from a gas panel 618 through entry ports 616 and form a gaseous mixture 646. The gaseous mixture 646 is ignited into a plasma 648 in the chamber 602 by applying power from the source 662 to the inductive coils 638 and by applying power from the dual RF source 104 to the substrate support pedestal 612. The two frequencies generated by the source 104 are generally selected in the high frequency range in order to promote plasma excitation and ion dissociation. However, the power may not be high enough to accomplish this and the source 104 may be utilized mainly to bias the substrate 614. The two frequencies generated by the source 104 are further differentiated by a predetermined span equal to a particular low frequency desirable, for example, for modulating the plasma sheath. The utilization of the dual frequency RF source 104 in combination with the source 662 provides more process control variables to control processing of the semiconductor substrate 614 in the chamber 602.

Typically, the chamber wall 634 is coupled to an electrical ground 652. The pressure within the interior of the chamber 602 is controlled using a throttle valve 650 and a vacuum pump 620. The temperature of the wall 634 is controlled using liquid-containing conduits (not shown) that run through the wall 634.

While the foregoing is directed to the illustrative embodiment of the present invention, other and further embodiments of the invention may be devised without departing from the basic scope thereof, and the scope thereof is determined by the claims that follow.

What is claimed is:

1. A method of generating and controlling a plasma in a semiconductor substrate processing chamber using a dual frequency RF source, comprising:
   supplying a first RF signal from the source to an electrode within the processing chamber at a first frequency; and
   supplying a second RF signal from the source to the electrode within the processing chamber at a second frequency different from the first frequency by a differential equal to a desired frequency between about 100 KHz to about 2 MHz, wherein characteristics of a plasma formed in the chamber establish a plasma sheath voltage modulation at the desired frequency.

2. The method of claim 1, wherein the first and second RF signals are coupled to the processing chamber through a common matching circuit having a single output to the electrode in the processing chamber.

3. The method of claim 1, wherein the first and second RF signals control a first defined subset of plasma characteristics and the frequency differential controls a second subset of plasma characteristics.

4. The method of claim 3, wherein the first defined subset of plasma characteristics comprises at least excitation of the plasma.

5. The method of claim 3, wherein the second defined subset of plasma characteristics comprises at least modulation of the plasma sheath.

6. The method of claim 3, wherein the first and second RF signals have an average frequency of about 13.5 MHz.

7. The method of claim 6, wherein the frequency differential ranges from about 100 KHz to about 1 MHz.

8. The method of claim 3, wherein the first and second RF signals have an average frequency of about 60 MHz.

9. The method of claim 8, wherein the frequency differential ranges from about 1 MHz to about 2 MHz.

10. The method of claim 1, further comprising:
    coupling a third RF signal to a gas to form the plasma.

11. The method of claim 10, wherein the first and second RF signals control a first defined subset of plasma characteristics, the frequency differential controls a second subset of plasma characteristics, and the third RF signal controls a third subset of plasma characteristics.

12. The method of claim 1, wherein the electrode is disposed within a substrate support pedestal.

13. A method of plasma processing in a semiconductor substrate processing chamber, comprising:
    creating a plasma in the processing chamber; and
    controlling a sheath voltage modulation of the plasma at a desired frequency between about 100 KHz to about 2 MHz by applying a first RF signal from an RF source to a first electrode within the processing chamber and applying a second RF signal from the source to the first electrode, wherein the first RF signal and the second RF signal have respective frequencies that are greater than the sheath voltage modulation frequency and that are different by a magnitude equal to the desired frequency.

14. The method of claim 13, wherein the controlling step further comprises:
    applying the first and second RF signals to the first electrode through a common matching circuit having a single output coupled to the electrode.

15. The method of claim 13, further comprising:
    coupling a third RF signal from a second RF source to the plasma.

16. The method of claim 13, wherein the first and second RF signals have an average frequency of about 13.5 MHz.

17. The method of claim 16, wherein the first RF signal and the second RF signal have a frequency differential of between about 100 KHz to about 1 MHz.

18. The method of claim 13, wherein the first and second RF signals have an average frequency of about 60 MHz.

19. The method of claim 18, wherein the first RF signal and the second RF signal have a frequency differential of between about 1 MHz to about 2 MHz.

20. A method of controlling a plasma, comprising:
supplying a first RF signal at a first frequency to a first electrode disposed in a processing chamber; and
supplying a second RF signal at a second frequency to the first electrode;
wherein the first and second frequencies are selected to control a first subset of characteristics of a plasma formed in the processing chamber and wherein a difference between the first and the second frequencies is equal to a third frequency between about 100 KHz to about 2 MHz selected to control a second subset of plasma characteristics different than the first.

21. The method of claim 20, wherein the second subset of plasma characteristics includes a sheath voltage modulation of the plasma.

* * * * *